(12) United States Patent
Knechtel

(10) Patent No.: US 7,509,875 B2
(45) Date of Patent: Mar. 31, 2009

(54) ELECTRICAL DETERMINATION OF THE CONNECTION QUALITY OF A BONDED WAFER CONNECTION

(75) Inventor: Roy Knechtel, Geraberg (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 0 days.

(21) Appl. No.: 11/576,929

(22) PCT Filed: Jan. 9, 2006

(86) PCT No.: PCT/DE2006/000017

§ 371 (c)(1),
(2), (4) Date: Sep. 19, 2007

(87) PCT Pub. No.: WO2006/072238

PCT Pub. Date: Jul. 13, 2006

(65) Prior Publication Data

US 2008/0011096 A1     Jan. 17, 2008

(30) Foreign Application Priority Data

Jan. 8, 2005   (DE) ................ 10 2005 001 104

(51) Int. Cl.
*G01N 3/08*   (2006.01)
*G01B 5/30*   (2006.01)
(52) U.S. Cl. ........................... 73/827; 73/760
(58) Field of Classification Search .......... 73/827, 73/760
See application file for complete search history.

(56) References Cited

U.S. PATENT DOCUMENTS 6,838,774 B2 *  1/2005  Patti ...................... 257/773

2002/0117728 A1 *  8/2002  Brosnihan et al. ......... 257/446

FOREIGN PATENT DOCUMENTS

DE   195 25 770   8/1996

OTHER PUBLICATIONS

Plaza, et al.: "Effect of silicon oxide, silicon nitride and polysilicon layers on the electrostatic pressure during anodic bonding." Elsevier Science S.A., 1998.
Bagdahn: "Low-Temperature Bonding." Doctoral thesis 2001, VDI-Verlag.
Amirfeiz, et al.: Workshop on Wafer Bonding for MEMS Technologies Halle/Germany 2004.
Pasquariello, D.: "Mesa-spacers: Enabling Nondestructive Measurement of Surface Energy in Room Temperature Wafer Bonding." Journal of Electrochemical Society, vol. 147, No. 6, pp. 2343-2346, 2000.

(Continued)

*Primary Examiner*—Max Noori
(74) *Attorney, Agent, or Firm*—Duane Morris, LLP

(57) ABSTRACT

The invention relates to a method and arrangement for carrying out the nondestructive determination of the connection quality of bonded wafers (1, 8) in order to verify the connection strength. The fact that an unbonded region (9) forms around a raised or recessed structure (3) on at least one of the connecting surfaces is made use of. The extension of the unbonded region is a measure of the strength of the wafer connection and is electrically determined by staggered contacts (5, 4) that, with the formation of the bond connection, close, only in part, via a contact strip (10).

22 Claims, 2 Drawing Sheets

OTHER PUBLICATIONS

Chen, et al.: "Contact Resistance Measurement of bonded Copper Interconnects for Three-Dimensional Integration Technology." IEEE Electron Device Letters, vol. 25, No. 1, Jan. 2004.

Go, et al.: "Experimental Evaluation of Anodic Bonding Process based on the Taguchi Analysis of Interfacial Fracture Toughness." Elsevier Sequoia S.A., Sensors and Actuators, vol. 73, No. 1-2, 1999.

* cited by examiner

Section A-A'
Schnitt A - A'

Detail B

ELECTRICAL DETERMINATION OF THE CONNECTION QUALITY OF A BONDED WAFER CONNECTION

The invention relates to a process for examining the strength of bonded wafer connections, it being possible that the wafers have different materials as wafers made of glass or other materials, it being also possible that the wafers are both processed and unprocessed, in particular at least one of the wafers is a semiconductor wafer. Not only the process for the non-destructive examination, but also the arrangement for making this examination possible, are concerned, which relates to the bonded arrangement as such consisting of at least two wafers and being structured in such a way that it can be tested with respect to the strength of the bonded connection through electrical connections.

An examination as such comprises conceptually both the possibility of the mere measurement and that of the monitoring involved in a process or in a manufacturing, wherein, in accordance with the circumstances and the fault tolerances specific limits must not be exceeded. Then, the monitoring of these limits may also be considered as an examination; the basic way of making this monitoring or examination possibility available is the measurement which is implemented electrically.

In microsystem technology the connection (stacking) of processed and unprocessed wafers made of semiconductor or other materials (e.g. glass) is widely spread. It serves for the encapsulation, for the three-dimensional integration and for the production of very thick layers. This process is mostly designated with the term "bonding" derived from the English language (bonding=connecting).

In addition to the claim to a defect-free connection, the bonding strength is of great importance. As a rule, destructive test processes are used for its evaluation, individual chips and/or special test structures being sawn out of the wafer composite, in order to mechanically load them in a tensile test, till they break, cf. Bagdahn, Festigkeit und Lebensdauer direkt gebondeter Siliziumwafer unter mechanischer Belastung, doctoral thesis 2001, VDI-Verlag.

A method working with electric currents for evaluating the bonding connection is described by Amirfeiz/Engstroem, Electrical characterization of oxygen plasma bonded Si/Si samples and SC1 bonded samples, Workshop on wafer bonding for MEMS technologies 2004, Halle/Germany. However, it can only be used to a limited extent, since it is based on the measurement of currents through the bonding connection, which, in addition to the bonding strength, depends on many further influences.

There is also a possibility of optically visualizing the bonding strength, cf. Plaza, Effect on silicon oxide, silicon nitride and polysilicon layers on the electrostatic pressure during anodic bonding, Sensors & Actuators A67, 1989. Here, the effect is used that unbonded areas are formed around raised structures, whose extension is a measure for the bonding strength. The strength can be inferred from the measurement of the unbonded length, it holding true that the smaller the unbonded area is, the stronger is the bonding strength. The optical evaluation of bonding connections is relatively complex and, consequently, susceptible to errors.

The invention is based on the object of designing a mechanically non-destructive process and an arrangement in such a way that the bonding connection can be tested with respect to its strength with an small error rate and characterized by an objective measuring value, in particular a rationalization of the control measuring process is to be achieved (also: test process).

According to the invention the quality of the bonding connection can be determined very quickly in a non-destructive fashion by means of electrical measurements. Customary devices for the electric wafer test can be used.

The process tests the strength of a bonded wafer connection in a non-destructive fashion. An area with a height deviation with respect to the surface level of the first wafer is located on the one wafer, mostly called carrier wafer. The first wafer comprises an insulator layer that is called "intermediate insulator". The defined height deviation must be understood in such a way that it must either be understood as a raised structure or as a lowered and/or depressed structure, in each case with respect to the surface level of the first wafer (carrier wafer) which is provided with an intermediate insulator layer.

This electrical test possibility is prepared prior to an actual bonding, electrical read-out contacts being provided in the surroundings of the elevated structure. They have given smaller or greater distances and increase in distance from the edge of the structure deviating in its level. The electrical read-out contacts are disposed on the intermediate insulator layer, i.e. they are unilaterally electrically insulated.

Preferably, the electric read-out contacts may extend in an elongated fashion substantially in parallel to an edge of an elevation or depression that is assumed as being polygonal. The electrical read-out contacts which are in each case provided with a supply line move away in a direction vertically to this edge, at whose end there is a connection which enables the connection of an electric voltage or an electric current from the outside for the supply to or for the conductance from the respective read-out contact.

A basically similar read-out contact with evaluation connection and a supply line disposed therebetween assumes the function position of a feed contact with a supply connection that is accessible from the outside. A supply line is also provided between supply connection and feed contact.

The second functionality of the supply is remotest from the edge of the depressed or raised structure as regards the feed contact. It is provided for being connected with a connection contact, e.g. a connection strip extending away from the edge and being electrically conductive. The connection is electrically conductive and extends at least from the feed contact in the direction towards the structure.

The area of the read-out contacts is explained in this fashion: it is located outside the raised or depressed structure and overlaps the boundary of the expected unbonded area around the raised or depressed structure towards the expected bonded area. The feed contact is located in the bonding area which is assumed as being reliably bonded and being remotest from the structure, but still in the surroundings of the (depressed or raised) structure. The read-out contacts approach and reach the expected unbonded area. In this respect, an extended transition area results as an intermediate zone which is located between the reliably bonded area and the reliably unbonded area. Then, the read-out contacts project into the reliably unbonded area.

Briefly, the read-out contacts and the feed contact will occupy an area located between the reliably bonded and the reliably unbonded areas so that an electric measurement can be implemented which is capable of detecting at least approximately an accurate boundary which is formed after the (more or less good) bonding. The corresponding resolution or accuracy results from the distances between the read-out contacts.

In an area which corresponds to the area of the read-out contacts (and of the feed contact), i.e. which overlaps it at least, said connection contact, e.g. as a strip-shaped, metallic conductor, is disposed on the second wafer, which must be bonded to the first wafer.

A bonding of the two wafers (mostly called carrier wafer and cover wafer) is implemented, an unbonded area being formed in the surroundings of the raised structure (or the lowered structure), briefly, in the surroundings of the "height-deviating structure", which is formed as a hollow space. The hollow space has a plane extension and a height extension, it being possible to measure the plane extension through said read-out contacts and the feed contact in connection which the connection contact (of the conductive layer extending in the lateral direction).

The electrical contacts through the connection contact, which are formed after the bonding, starting from the feed contact and to at least one or several of the read-out contacts, can result, due to contact current measurement(s), in that that part can be substantially ascertained, at which the hollow space begins to grow in the height direction, and/or at which part there is no longer any reliably bonded area. Then, the area of the extension of the unbonded area forms an electrically measurable measure of the strength of the bonding connection by the at least one contact current measurement.

A contact current measurement is implemented from an external supply connection (via the feed contact) to the or the several further external evaluation connections which, in turn, are connected with the one or the several electrical read-out contacts in an electrically conductive fashion, which are located between the feed contact and the edge of the raised/depressed structure.

The process or the arrangement can also be designed in such a way that the function and the functional elements of the first and second wafers are exchanged, i.e. a raised structure is formed on the second wafer (mostly: cover wafer) or a depressed structure is also formed on the second wafer (mostly: cover wafer). In this respect the change of the surface level of the first wafer (or the second wafer) is decisive, which may extend in the one or the other height direction, and this in the one or the other wafer.

The two surfaces facing each other, one of which at least locally changed as regards its height, will then be joined to one bonding and with one bonding so that the unbonded area is formed around the core, i.e. around the change in height, which can be electrically measured between the bonded area and the unbonded area in the grid of the read-out contacts as regards its outer boundary.

In an extreme case only one evaluation contact is provided which can be connected in an electrically conductive fashion with the feed contact via the connection contact so that a yes/no or good/poor measurement is possible. The more read-out contacts are provided, the more accurate is the measurement regarding the quality or strength of the implemented bonding.

The arrangement can be integrated in a wafer layout. The process can be used almost at the same time in the bonding process in the production.

The invention is explained and supplemented by means of examples with the aid of the drawings.

FIG. 1 shows a top view of a measuring arrangement (in the outlined horizontal section) with a raised structure 3 on one of the surfaces of the wafers 1, 8 to be connected and electrical measuring contacts 5 disposed in a surrounding area (e.g. as 5a, 5b, 5c) which move away in a stepwise fashion and in a spaced fashion from the edge 3' of the raised structure 3;

Figure 2:
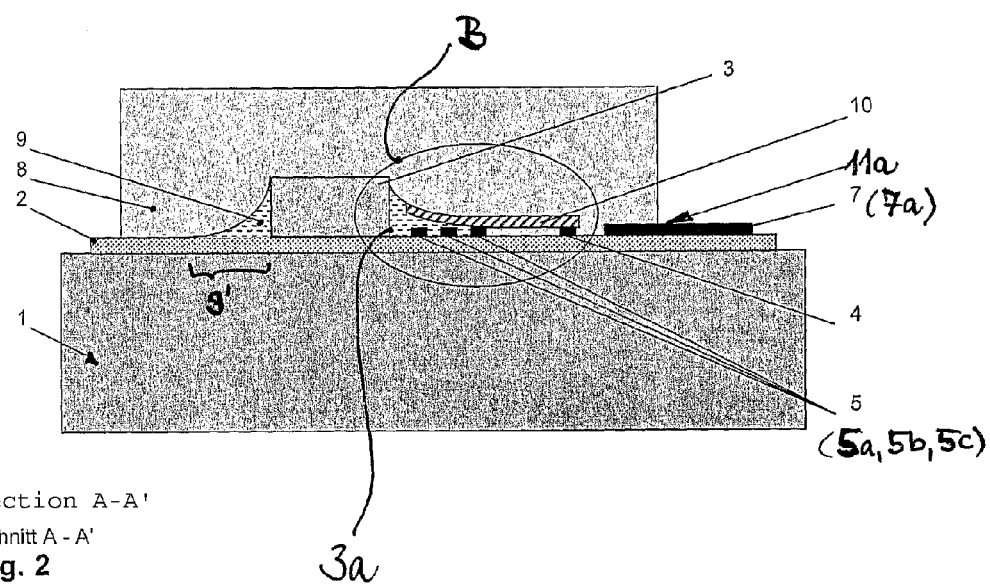
FIG. 2 shows the measuring arrangement of FIG. 1 in a sectional representation A-A'.

An intermediate insulator 2 is located on a carrier or system wafer 1 ("Systemascheibe"), briefly called "first wafer", in order to insulate the contact structures 4, 5, 6, 7 with respect to the support. A raised structure 3 is located on this layer 2, around which an unbonded area 9 is formed later during bonding, whose lateral extension 9' is shown in the section of FIG. 2. A circle is symbolically provided as the boundary between unbonded and bonded areas. Other shapes are likewise possible.

A feed contact surface 4 is present in a structured conductive layer, e.g. of a metal, outside an expected unbonded area, which is connected to the supply connection 6 by means of a supply line 11'. The read-out contacts 5 (e.g. as 5a, 5b and 5c) are placed in an enlarged transition area 15 between the (reliably) bonded area and the (reliably) unbonded area around the raised structure 3 and connected with the evaluation connections 7 (e.g. as 7a, 7b and/or 7c). The connection is effected via lines 11a, 11b and/or 11c. A further conductive structure 10 is applied onto the cover wafer 8, which, in particular in a strip shape, covers and/or bridges the area of feed contact and evaluation contacts.

A contact between the feed contact 4 and the cover wafer metallization 10 is formed during bonding as a conductive structure. This electrical contact is continued at the evaluation connections 5a, 5b, 5c as a function of the bonding strength. It applies in this connection that the read-out strip 5a which is most remote from the raised structure is at first formed in a closed fashion as the contact K. With increasing bonding strength, the other contacts are closed at the further read-out strips 5b, 5c, . . . so that in the case of a sufficiently strong bonding connection only a few open contacts O (n.c. or not connected) result directly next to the raised structure 3.

By introducing a current I into the feed contact 4 and measuring it at one of the evaluation connections 5, it can be ascertained in a very simple fashion which contacts are closed and which are still open. The lateral extension 9' of the unbonded area 9 can thus be found out by at least one, but mostly several contact current measurements. The more contacts 5 have electrical continuity with the power supply 6, the shorter is the area 9' and the stronger is thus the bonding connection.

Figure 1:
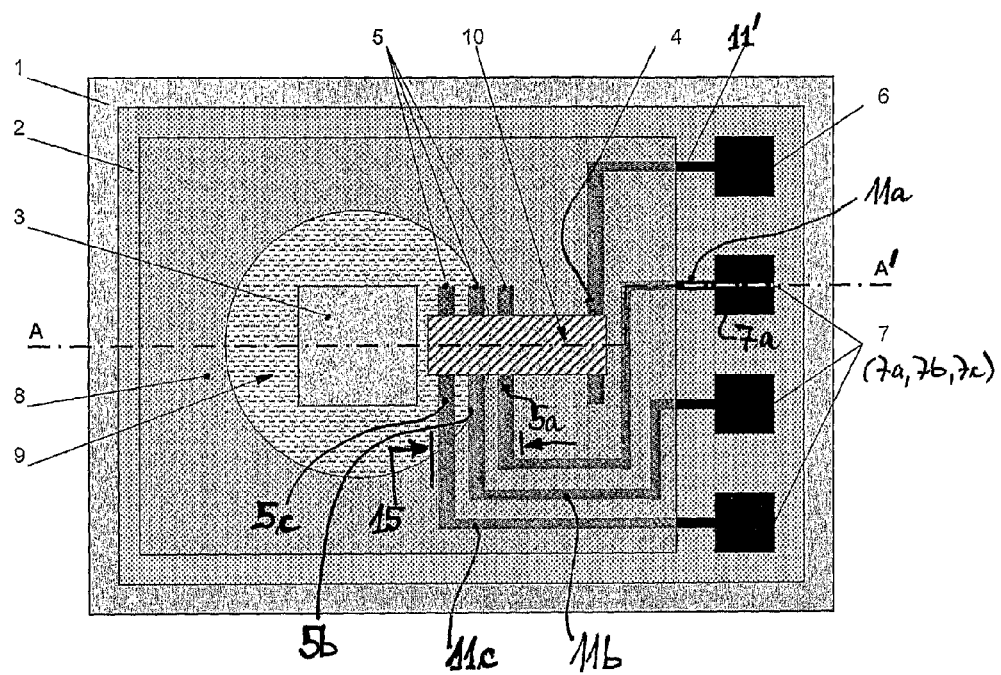
Figure 3:
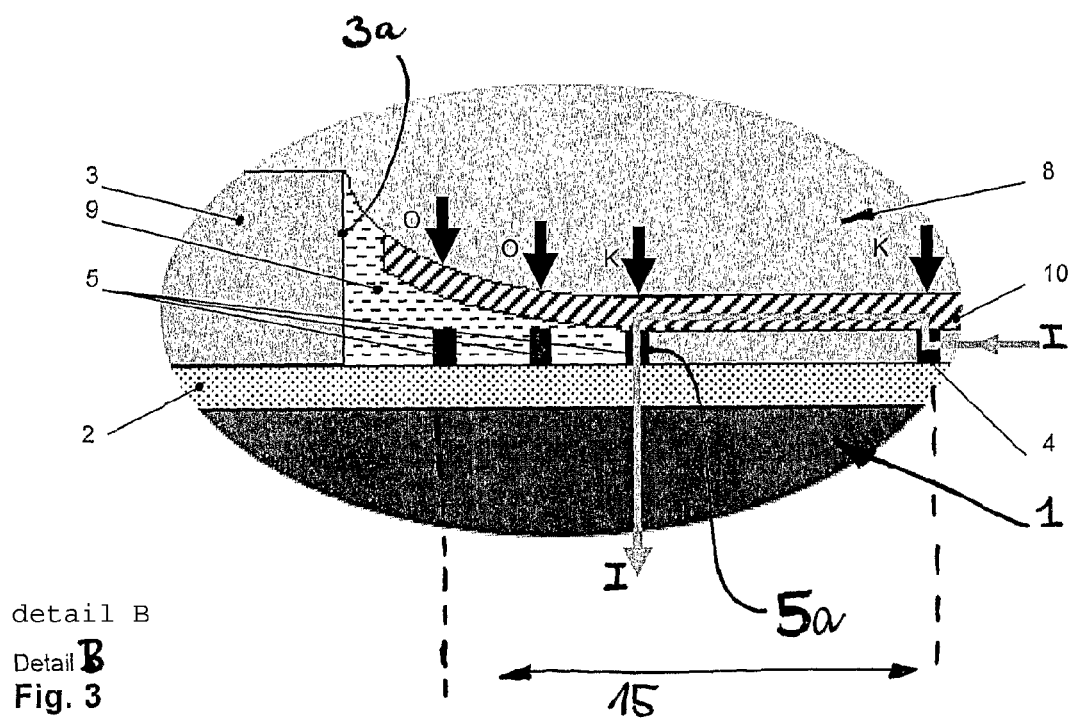
FIG. 3 shows an enlarged detail from FIG. 2 with a process of the contact current measurement 1.

A further example, which is not separately represented, but can be easily envisaged from FIG. 1 to 3, deals with a depressed irregularity at the point of the raised structure 3 of FIG. 2 (the sectional representation). This depressed irregularity in the cover wafer 8 can be envisaged such that the structure 3 is omitted and, instead, a hollow space is formed in the cover wafer, which forms the depression. If such a cover wafer is bonded onto the system wafer 1 (also called carrier wafer), the entire area 9, 3 is formed as a hollow space with the same possibility of the measurement of the transition zone between the unbonded hollow space and the well bonded area there, where the feed contact extends. This changed embodiment can be easily envisaged by means of the given design so that it is not separately represented. The modified figures of FIG. 1 and FIG. 3 can then be envisaged in a correspondingly adapted form.

A further embodiment which also must not be especially represented is that, in which the insulating layer 2 is disposed on the cover wafer, and the read-out contacts 5 and the feed contact 4 accordingly reversely directed towards the carrier wafer 1. Then, the strip-shaped connection contact 10 is provided on the carrier wafer 1 in order to be in contact with the feed contact and to then rest on at least one or several of the read-out contacts 5 in an electrically conductive fashion and/ or to contact them in a low-impedance conductive fashion so that a through-level measurement can be carried out.

The three described examples can also be modified accordingly with the one or the other position of the insulator layer 2, with the one or the other position of a raised structure 3 or with one or the other position of a depressed, recessed structure corresponding to the elevation, the one or the other position relating to the first or the second wafer 1, 8. Corresponding representations and corresponding statements, in which the functions and the functional elements are exchanged in a corresponding representation can easily be drawn and understood by a person skilled in the art of semiconductor system technology from this general paraphrase.

A supplementation to the contact current measurement is to be implemented due to the plurality of possible measurements.

A contact current measurement can be effected with a real current which, then, is fed from its current source on pad 6 as supply connection, then flows through the connection contact 10 (as current path) and flows at least into one of the read-out contacts 5a, 5b, 5c according to FIG. 1 in order to be measured at the corresponding evaluation connections 7a, 7b, 7c. Instead of a current, a voltage can also be applied to the supply connection 6 so that the corresponding voltage can be measured at one or several evaluation connections 7a, 7b, 7c, and it can be ascertained in practically one simultaneous measurement, which of the contacts 5a to 5c are connected with the supply connection 6 in an electrically conductive fashion in accordance with the reference numeral K of FIG. 3 or which contacts are not connected in accordance with the reference numeral O according to FIG. 3.

This one contact current measurement, e.g. in the path via 6a, 11', 4, 10, 5a, 11a, 7a thus detects basically both the current flow and also a voltage transmission via a low-impedance contact formed and detects likewise the individual measurements of each of the read-out contacts 5, which take place successively and also the joint simultaneous detection of all potentials or currents of the read-out contacts 5 at the evaluation connections 7.

The edge 3a of the raised structure, of which the first measuring contact which is closest to this structure and has the reference numeral 5c in the example according to FIG. 1 is spaced, represents the beginning of the hollow space 9 whose height is reduced towards the exterior. If a depression is provided, i.e. without the structure 3, an edge of the depression basically results, which is designed in accordance with a vertical extension of the depression, said extension being vertical to the surface. The height of the depression is decreased subsequently and thus forms the hollow space.

The area of the contacts 5, 4 (the read-out contacts and the feed contact) is organized in both cases in such a way that it extends away from the structure or the depression in defined distances beyond a boundary between the bonded area and the unbonded area. The appertaining connection strip 10 overlapping these contacts must not occupy the complete longitudinal extension of the contacts 4, 5 in the width direction, but can also only cover a partial area, it being oriented in the longitudinal direction towards the structure 3 or the depression replacing it.

Only a few evaluation contacts—only one in the extreme case—are necessary for the inspection as measurement or monitoring of the bonding process. For a real or more accurate examination of the strength the distances of the evaluation contacts 5a, 5b, 5c may be graduated in a finer fashion; they may in particular be disposed on several sides of the raised/depressed structure 3. The strength of the bonding connection appertaining to the respective contact 5 (5a or 5b or 5c or further contacts) can be calculated by means of an FEM simulation.

The arrangement of the example can be integrated in a wafer layout and electrically measured on the wafer basis. This is possible directly with the bonding process in the production. The measurement can be implemented together with other electrical parameters and be documented in a simple fashion.

REFERENCE NUMERALS 1 carrier or system wafer (system wafer) or "first" wafer
2 intermediate insulator layer
3 raised structure with edge 3a
4 feed contact
5 read-out contacts; 5a, 5b, 5c
6 supply connection with supply line 11'
7 evaluation connections; 7a, 7b, 7c
8 cover wafer (or second wafer)
9 unbonded area, lateral extension 9'
10 metallization on the cover wafer as a connection contact/path
11 supply lines; 11a, 11b, 11c of connections 7a, 7b, 7c
15 extended transition area between bonding area and unbonded area
K contact closed
O contact open (n.c.)
I electrical current from 6 through 11; 10, 5a, 11a and 7a

I claim:

1. A process for the non-destructive examination as a measurement or monitoring of the strength of bonded wafer connections, in which an area with a defined height deviation is formed as a raised or depressed structure (3) with respect to the surface level of the first wafer (1) provided with an intermediate insulator layer on the one wafer (1), wherein electrical read-out contacts (5) are generated in the surroundings of the structure (3) deviating from the surface level at defined distances from the edge of the structure (3) on the intermediate insulator layer (2) of the one wafer (1) with supply lines and evaluation connections (7) and a feed contact (4) with a supply connection (6) and a connection path (10) is formed on the second wafer (8) in an area which overlaps the area of the read-out contacts (5), which, after the bonding, forms an electrical contact with the feed contact (4) to the supply connection (6), wherein, after the bonding, an unbonded area (9) is formed as a hollow space in the surroundings of the raised or depressed structure (3) and the plane extension of the unbonded area (9) is determined as a measure of the strength of the bonding connection by means of a contact current measurement from the supply connection (6) to the evaluation connections.

2. A process for the non-destructive examination of the strength of bonded wafer connections, in which an area with a defined height deviation is formed as a structure which is depressed with respect to the surface level of the carrier wafer (1) provided with an intermediate insulator layer on the wafer (1), whereby, after an implemented bonding, an unbonded area (9) is formed as a hollow space in the surroundings of an edge of the depressed structure, wherein electrical read-out contacts (5) are generated in the surroundings of the depressed structure at defined distances from the edge (3a) of the depressed structure on the intermediate insulator layer (2) of the carrier wafer (1) with supply lines and evaluation connections (7) and a feed contact (4) with a supply connection (6), and a connection contact (10) is formed on the cover wafer (8) in an area located in the area of the read-out contacts (5), which, after the implemented bonding, forms an electrical contact with the feed contact (4) to the supply connection (6), wherein the extension of the unbonded area (9) is determined as a measure of the strength of the bonding connection by means of contact current measurements from the supply connection (6) to the evaluation connections (7).

3. The process as claimed in claim 2, wherein the functions and functional elements are exchanged as regards the carrier wafer (1) and the cover wafer as the depressed structure is formed on the cover wafer (8).

4. The process as claimed in claim 1, wherein the functions and functional elements are exchanged as regards the first and second wafers wherein raised or depressed structure (3) is formed on the second wafer (8).

5. An arrangement for the non-destructive examination of the strength of bonded wafer connections, in which an area with a defined height deviation is present as a raised structure (3) with respect to the surface level of the carrier or system wafer (1) provided with an intermediate insulator layer on the carrier or system wafer (1), whereby, after the bonding, an unbonded area (9) was formed as a hollow space in the surroundings of the raised structure (3), wherein read-out contacts (5) are present in the surroundings of the raised structure (3) at defined distances from the edge of the raised structure (3) on the intermediate insulator layer (2) of the carrier or system wafer (1) with supply lines and evaluation connections (7) and a feed contact (4) with a supply connection (6), and a connection contact (10) is formed on the cover wafer (8) in an area corresponding to the area of the read-out contacts (5), which, after the bonding, has an electrical contact with the feed contact (4) to the supply connection (6), wherein the extension of the unbonded area (9) is determined as a measure of the strength of the bonding connection by means of contact current measurements by means of the supply connection (6) at the evaluation connections (7).

6. An arrangement for the non-destructive examination of the strength of a bonded wafer connection, in which an area with a defined height deviation is present as a structure (3) that is depressed with respect to the surface level of the carrier or system wafer (1) provided with an intermediate insulator layer on the carrier or system wafer (1), whereby, after the implemented bonding, an unbonded area (9) was formed as a hollow space in the surroundings of the edge of the depressed structure, and wherein several read-out contacts (5) are present in the surroundings of the depressed structure at defined distances from the edge of the depressed structure on the intermediate insulator layer (2) of the carrier wafer (1) with supply lines (11) and evaluation connections (7) and a feed contact (4) with a supply connection (6), and a connection contact (10) is formed on the cover wafer (8) in an area corresponding to the area of the read-out contacts (5), which, after the bonding, has an electrical contact with at least the feed contact electrically connected to the supply connector;

wherein the extension of the unbonded area (9, 9') can be determined as a measure of the strength of the bonding connection of the wafers (1, 8) by means of one or several contact current measurements by means of the supply connector (6) at the evaluation connections (7).

7. The arrangement as claimed in claim 5, wherein the functions and functional elements are present in an exchanged fashion as regards the carrier or system wafer (1) and the cover wafer as the raised structure (3) is formed on the cover wafer (8).

8. The arrangement as claimed in claim 6, wherein the functions and functional elements are present in an exchanged fashion as regards the carrier or system wafer (1) and cover wafer (8) whereby the depressed structure (3) is formed on the cover wafer (8).

9. The arrangement as claimed in claim 5 or claim 6, wherein the connection contact (10) is formed as a plane strip.

10. A process for a non-destructive examination of a strength of a bonded wafer connection of a first wafer (1) provided with an intermediate insulator layer (2) and a cover wafer (8) as a second wafer, (a) wherein an area with a defined height deviation as a raised structure (3) with respect to a surface level of the first wafer (1) is provided on the first wafer (1);

(b) with a bonding of the wafers (1, 8);

(c) whereby, after the bonding of the wafers, an unbonded area (9) is formed as a hollow space in a surrounding area of the raised structure (3);

wherein (d) electric read-out contacts (5) are generated at least in a first area which is located in the surrounding area of the raised structure (3), which are placed at defined distances from the edge (3a) of the raised structure and on the intermediate insulator layer (2) of the first wafer (1);

(e) supply lines and evaluation connections (7, 11) and a feed contact (4) with a supply connection (6) are generated and a conductive contact surface is formed as a connection contact (10) on the cover wafer (8) in the area corresponding at least to an area of the contacts (4, 5), in order to form an electrically conductive contact with the feed contact (4) to the supply connection (6) after a bonding;

(f) wherein the extension of the unbonded area (9) is determined as a measure of the strength of the bonding connection by at least one contact current measurement via the supply connection (6) with at least one evaluation connection (7).

11. The process as claimed in claim 10, wherein the functions and functional elements are exchanged as regards the first wafer (1) and second wafer (8).

12. A process for the non-destructive examination of the strength of bonded wafer connections, in which an area with a defined height deviation as a structure being depressed with respect to the surface level of the carrier wafer being provided with an intermediate insulator layer is provided on the carrier wafer (1); wherein read-out contacts (5) are generated at least in the surroundings of the depressed structure at defined distances from an edge of the depressed structure on the intermediate insulator layer (2) of the wafer (1) with supply lines and evaluation connections (7) and a feed contact (4) with a supply connection (6), and a connection path (10) is formed on the cover wafer (8) in an area corresponding at least to the area of the read-out contacts (5), which, after the bonding, forms an electrical contact with the feed contact (4) to the supply connection (6); bonding of the wafer (8, 1), wherein, after the implemented bonding, an unbonded area (9) is formed as a hollow space in the surroundings of the edge of the depressed structure and the extension of the unbonded area (9) is determined as a measure of the strength of the bonding connection by contact current measurements from the supply connection (6) at the evaluation connections (7).

13. The process as claimed in claim 10 or 12, wherein the raised or depressed structure (3) is formed on the cover wafer (8) whereby cover and carrier wafers are exchanged as bonding partners.

14. The process as claimed in claim 10 or 12, wherein the connection path is a strip extending in the direction away from the structure (3).

15. An arrangement for the non-destructive examination of the strength of bonded wafer connections, in which an area with a defined height deviation is present as a raised structure (3) with respect to a surface level of the carrier or system wafer (1) provided with an intermediate insulator layer on the carrier or system wafer (1), whereby, after the bonding, an unbonded area (9) was formed as a hollow space in the surroundings of the raised structure (3), wherein read-out contacts (5) are present in the surroundings of the raised structure (3) at defined distances from the edge of the raised structure (3) on the intermediate insulator layer (2) of the carrier or system wafer (1) with supply lines and evaluation connections (7) and a feed contact (4) with a supply connection (6), and a connection contact (10) is present on the cover wafer (8) in an area corresponding to the area of the read-out contacts (5), which, after the bonding, has an electrical contact with the feed contact (4) and the supply connection (6), wherein the extension of the unbonded area (9) can be determined as a measure of the strength of the bonding connection by means of at least one contact current measurement between the supply connection (6) and the evaluation connections (7).

16. An arrangement for the non-destructive examination of the strength of bonded wafer connections, in which an area with a defined height deviation was provided as a structure that is depressed with respect to the surface level of the carrier or system wafer (1) provided with an intermediate insulator layer on the carrier or system wafer (1), whereby, after the bonding, an unbonded area (9) was formed as a hollow space in the surroundings of the edge of the depressed structure, wherein read-out contacts (5) are present in the surroundings of the depressed structure at defined distances from the edge of the depressed structure on the intermediate insulator layer (2) of the carrier or system wafer (1) with supply lines and evaluation connections (7) and a feed contact (4) with a supply connection (6), and a connection contact (10) was formed on the cover wafer (8) in an area corresponding to the area of the read-out contacts (5), which, after the bonding, has an electrical contact with the feed contact (4) and the supply connection (6), wherein the extension of the unbonded area (9) is determined as a measure of the strength of the bonding connection by means of contact current measurements by means of the supply connection (6) at the evaluation connections (7).

17. The arrangement as claimed in claim 15, wherein the functions and functional elements are present in an exchanged fashion as regards the carrier or system wafer (1) and the cover wafer (8) whereby the raised structure (3) is formed on the cover wafer (8).

18. The arrangement as claimed in claim 16, wherein the functions and functional elements are present in an exchanged fashion as regards the carrier or system wafer (1) and cover wafer (8) whereby the depressed structure is formed on the cover wafer (8).

19. The process as claimed in claim 10, wherein the first wafer is a carrier or system wafer as the carrier wafer (1).

20. The process as claimed in claim 10, wherein the steps (b) and (c) are carried out after step (e) and the unbonded area has an extension (9') on the narrower surrounding area of the structure (3).

21. The process as claimed in claim 10, wherein the feed contact is arranged in the first area and extends towards the outside in the surrounding area of the structure (3).

22. The process as claimed in claim 10, wherein the area of the contacts (4, 5) extends away from the structure (3) beyond a boundary between the bonded and unbonded areas.

* * * * *